United States Patent
Diaz et al.

(10) Patent No.: US 10,880,622 B2
(45) Date of Patent: Dec. 29, 2020

(54) ASSEMBLY FOR HIGH-SPEED INTERCONNECTION OF DIGITAL ELECTRICAL COMPONENTS

(71) Applicant: TELEFONAKTIEBOLAGET LM ERICSSON (PUBL), Stockholm (SE)

(72) Inventors: Randall Diaz, Gilroy, CA (US); Allen Hirashiki, San Ramon, CA (US); Juan Luis Cruz, Santa Clara, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 134 days.

(21) Appl. No.: 16/094,823

(22) PCT Filed: Jul. 29, 2016

(86) PCT No.: PCT/IB2016/054589
§ 371 (c)(1),
(2) Date: Oct. 18, 2018

(87) PCT Pub. No.: WO2017/182858
PCT Pub. Date: Oct. 26, 2017

(65) Prior Publication Data
US 2019/0124422 A1    Apr. 25, 2019

Related U.S. Application Data (60) Provisional application No. 62/325,398, filed on Apr. 20, 2016.

(51) Int. Cl.
*H05K 7/00* (2006.01)
*H04Q 1/02* (2006.01)
(Continued)

(52) U.S. Cl.
CPC .............. *H04Q 1/09* (2013.01); *H04Q 1/023* (2013.01); *H04Q 1/06* (2013.01); *H05K 7/186* (2013.01); *H05K 7/20572* (2013.01)

(58) Field of Classification Search
CPC ........... H04Q 1/09; H04Q 1/023; H04Q 1/06; H05K 7/186; H05K 7/20572
See application file for complete search history.

(56) References Cited

U.S. PATENT DOCUMENTS

2005/0162836 A1    7/2005  Briggs et al.
2007/0211439 A1*   9/2007  Shimizu ............ H05K 7/20736
                                                      361/724

(Continued)

*Primary Examiner* — Pete T Lee
(74) *Attorney, Agent, or Firm* — Sage Patent Group (57) ABSTRACT

A modular cable backplane assembly for high-speed interconnection of digital electrical components in Field Replaceable Units, FRUs, (12) mounted in an equipment rack (10). A vertical stack of a plurality of parallel horizontal cable connector carrying trays (51) is mounted within a rigid chassis (32). The trays provide electrical component connector pins on a front side and high-speed data and power cable connectors on a back side thereof. At least one enclosed vertical channel (21) is attached to the vertical stack of horizontal plates (51) for protectively routing cables to the cable connector carrying trays. Vertical spacing of the cable connector carrying trays enables cooling fans (41) mounted on the rigid chassis to provide unimpeded front-to-back airflow over the FRUs (12). The cable backplane assembly may be removed and replaced as a unit, and may be upgraded, in situ, from copper to optical connections.

21 Claims, 10 Drawing Sheets

(51) Int. Cl.
*H04Q 1/06* (2006.01)
*H05K 7/18* (2006.01)
*H05K 7/20* (2006.01)

(56) References Cited

U.S. PATENT DOCUMENTS

| | | | |
|---|---|---|---|
| 2011/0013348 A1* | 1/2011 | Seibold | G06F 1/20 361/679.02 |
| 2011/0268412 A1* | 11/2011 | Giraud | G02B 6/4452 385/135 |
| 2011/0317974 A1* | 12/2011 | Krampotich | G02B 6/4457 385/135 |
| 2013/0183018 A1* | 7/2013 | Holmberg | G02B 6/3893 385/135 |
| 2015/0116976 A1 | 4/2015 | Ritter et al. | |
| 2015/0129287 A1* | 5/2015 | Ritter | H04Q 1/09 174/255 |

* cited by examiner

ASSEMBLY FOR HIGH-SPEED INTERCONNECTION OF DIGITAL ELECTRICAL COMPONENTS

CROSS-REFERENCE TO RELATED APPLICATIONS

This application is a national stage of International Application No. PCT/IB2016/054589, filed Jul. 29, 2016, which claims the benefit of U.S. Provisional Application No. 62/325,398, filed Apr. 20, 2016, which is hereby incorporated by reference.

FIELD OF THE DISCLOSURE

The present disclosure relates generally to digital electrical systems, and more particularly to a cable backplane assembly for high-speed interconnection of digital electrical components and/or electrical component assemblies such as Printed Circuit Board Assemblies (PCBAs).

BACKGROUND

The central element for the majority of electronic systems involves interconnecting various digital electrical components and/or electrical component assemblies. Currently for Information and Communication Technology (ICT) systems, the predominant implementation involves deploying Printed Circuit Board (PCB) technology on fixed backplanes that interconnect signals between multiple systems. Removable Field Replaceable Units (FRUs) with identical depths are blind-plugged into a fixed PCB backplane (or mid-plane if the FRUs are plugged in from either side, typically front and back of an Electronic Industries Alliance (EIA)-type rack mounted system), plugged together and connected by readily available data signal and power connectors. This creates the required intra-system interconnection.

Increasingly, these systems require greater numbers of interconnected devices/FRUs running at increasing signal, channel, and link speeds. System architects are looking to alternative methods to accommodate these increasing challenges borne by the explosion in Internet traffic and interconnected mobile devices. Adding to these challenges is the pace at which system device technologies evolve—requiring adaptive and accommodating changes to the system's interconnecting infrastructure.

SUMMARY

Problems existing with current high-end electronic systems include the inability to handle signal speed and signal integrity, physical limitations to providing for adequate switching fabric size (aggregate signal counts) and adequate FRU/line card (LC) count densities, and cooling and power distribution limitations.

Currently, high-speed electronic interconnect systems such as high-end routers are reaching their data speed and requisite Signal Integrity (SI) characteristics limits with conventional system components, namely those that utilize PCB technology for fixed backplanes. Even the best high-end PCB dielectric materials such as Megtron 6 have reached their limit for data speed transmission, currently at 25 Gbps. Moreover, the digital quality (i.e., SI) of these signals is compromised at these speeds and places length restrictions on embedded traces within the backplane PCB. The need for a different mechanism for making the electrical signal interconnects within leading edge systems has become evident—fixed PCB backplanes and conventional methods will soon no longer suffice. Additionally, signal transmission will need to move to optical componentry, and no path for achieving this exists.

With core ASIC components residing within FRUs evolving faster than the systems they are housed within, system owners are faced with technological obsolescence of their equipment. Switching fabric capacities are expressed in number of "lanes", which are quantified physically by distinct copper or optical-based signal-carrying mediums. Router system infrastructures are not keeping up with the proliferation of lanes provided by Network Processing Unit (NPU) manufacturers. If the system infrastructure cannot keep up with the number of signals, the system owner is left with non-competitive, obsolete equipment, necessitating replacement, assuming replacement high-capacity systems are available. Replacing entire racks filled with obsolete infrastructures, not to mention the multitudes of I/O cables installed therein requires downtime and substantial manpower and equipment to achieve, typically referred to as a 'forklift upgrade'. Cost is substantial also, particularly if new LCs are required. The customer's investment cannot be protected with current system designs.

Also at the breaking point of high-end core router system design is the system capacity itself. The Internet of Things (IoT) is driving the number of connected devices, in turn driving up the number of I/O ports required in a system, thereby driving up the number of LCs in a system, which are constrained by the physical rack size in which they are housed. Also impacting the available rack size are other system elements such as cooling and power distribution devices. Most ICT systems do not allow for front-to-back airflow as found in data centers, and those that do are limited in cooling capacity. System component densities are at the point where conventional solutions are inadequate to provide the necessary product features. Ideally, a system design would be able to adapt to increasing aggregate port quantities, providing the ability to scale from the onset.

The disclosed assembly enables air cooling 80 kW in an equipment rack by providing a three dimensional cable backplane with openings that let airflow pass without changing directions. A modular approach enables field replacement of the cable backplane and field upgrade to transition from copper to fiber optics.

In one embodiment, the disclosure is directed to a cable backplane assembly for high-speed interconnection of digital electrical components and/or electrical component assemblies mounted in an equipment rack. The assembly includes first and second rigid vertical side plates attached to a top plate and a bottom plate to form a rigid chassis; a vertical stack of a plurality of parallel horizontal cable connector carrying trays received within the rigid chassis, wherein the cable connector carrying trays are configured with electrical component connector pins on a front side and high-speed data and power cable connectors on a back side thereof; at least one enclosed vertical cable channel attached to the vertical stack of cable connector carrying trays for protectively routing cables to the cable connector carrying trays; and mounting points for a plurality of cooling fans aligned with each of the plurality of cable connector carrying trays to provide front-to-back cooling airflow.

In another embodiment, the disclosure is directed to a removable cable backplane assembly providing high-speed interconnection of digital electrical components in Field Replaceable Units (FRUs) mounted in an equipment rack. The assembly includes four vertical corner rails attached to a top plate and a bottom plate to form a rigid chassis; a vertical stack of a plurality of parallel horizontal cable connector carrying trays received within the rigid chassis, wherein the cable connector carrying trays are configured with electrical component connector pins on a front side and cable connectors on a back side thereof; and at least one enclosed vertical cable channel received within the chassis for protectively routing cables to the vertical stack of parallel horizontal cable connector carrying trays. The cable backplane assembly is replaceably received in the rack to enable the cable backplane assembly to be removed and replaced as a unit.

In another embodiment, the disclosure is directed to a method of cooling digital electrical components in Field Replaceable Units (FRUs) mounted in an equipment rack. The method includes forming a rigid chassis by attaching first and second rigid vertical side plates to a top plate and a bottom plate; mounting within the rigid chassis, a vertical stack of a plurality of parallel horizontal cable connector carrying trays, wherein the cable connector carrying trays are configured with electrical component connector pins on a front side and high-speed data and power cable connectors on a back side thereof; and attaching at least one enclosed vertical channel to the vertical stack of cable connector carrying trays for protectively routing cables to the cable connector carrying trays. The method also includes slidably and removably installing the FRUs by connecting the FRUs to the electrical component connector pins on the front side of the vertical stack of cable connector carrying trays; and mounting a plurality of cooling fans aligned with each of the plurality of cable connector carrying trays to provide front-to-back cooling airflow over the FRUs. Vertical spacing of the plurality of parallel horizontal cable connector carrying trays enables the cooling fans to provide unimpeded front-to-back airflow over the FRUs.

In another embodiment, the disclosure is directed to a method of converting, in situ, the cable backplane assembly of claim 1 from copper connections to optical connections. The method includes disconnecting the digital electrical components and/or electrical component assemblies from the cable connector carrying trays; removing the cooling fans and associated shelves from the back of the rack; attaching at least one modular fiber case to at least one enclosed vertical cable channel; connecting the at least one modular fiber case to the cable connector carrying trays; remounting the cooling fans and associated shelves to the back of the rack; and reconnecting the digital electrical components and/or electrical component assemblies to the cable connector carrying trays.

The disclosed assembly provides multiple advantages over existing solutions. These include:

1. Allows front-to-back airflow with highest possible signal counts, and maximum possible internal chassis interconnect speeds with optimal SI;
2. Offers highest copper performance without having to bear high cost of optical;
3. Modularity of the design enables an upgrade path from copper, to hybrid interconnect (copper and/or optical), and to pure optical (see FIG. 8 for FRUs depicting interconnect upgrade methodology);
4. Provides 3-dimensional interconnect planes, allowing different length FRUs and FRUs with multiple interconnect/interface depth (see FIGS. 6 and 7);
5. Enables 3-axis 'floating' of backplane side connectors for increasing allowable mating FRU misalignment, yielding best in class fit tolerance resolution (see FIGS. 9 and 10);
6. Makes possible ultra-high density pin fields (compared to orthogonal) by spreading the pin fields across the entire width of the circuit board. This reduces the distance between connectors and switch fabric components. (see FIG. 8);
7. Strategically avoids "forklift upgrades" of racks/chassis—the modularity of the design makes possible field configurability and upgradeability providing investment protection with future-proofing: starting with copper, next hybrid with copper and optical simultaneously, then pure optical (see FIGS. 3 and 14);
8. Allows for taller 'backplane' height than conventional 2D PCBs, translating to electrically reaching more LCs;
9. Provides easier manufacturing assembly and repair through the use of snap-in assembly of interface blocks, which prevent scrapping very expensive 2D backplanes for yields or repairs;
10. Eliminates requirement to back-drill PC—also eliminates PCB fabrication defects such as "footballing", where PCB backplane or mid-plane is thicker in the middle than outer edges;
11. Achieves 100% test—easier to test completely, less dedicated test machines and fixtures are required;
12. Makes improved deployment of connectors of any combination, speed, type or vendor, by not being constrained to through-hole or via technologies and their resulting complications and limitations;
13. Allows for greater flexibility in providing power to FRU slots, enabling a path to higher-power inputs without connector capacity limitations;
14. Makes possible variable, configurable FRU slot pitch;
15. Allows for identical FRUs installed back-to-back without affecting front-to-back cooling airflow (see FIG. 6);
16. Provides structural elements for any blind-plug electronic components, in particular liquid cooling fittings, which are not readily accomplished with PCBs and requisite board space;
17. Offers improved Electro Magnetic Compatibility (EMC) via fully enclosed, contained metal or metallic housings—there are no Electro Magnetic Interference (EMI) gaps at the interface of the FRU to the fixed backplane. Also, radiating plane of a fixed PCB-type backplane is eliminated, enabling lower cost structural packaging due to the self-contained nature of the assembly (see FIGS. 3 and 4);
18. Avoids costly, prone-to-error in precision, and lower yield processes in PCB fabrication such as back-drilling of vias on increasingly thicker boards and the accompanying aspect ratios for drilling;
19. Provides a way to interconnect 72 lanes or more of switching fabric. Most conventional PCB-PCB or direct-plug orthogonal (DPO) systems cannot tolerate the projected required mating connector size in excess of 128 pairs per connector block. Very large connector blocks using a conventional backplane result in very wide spacing requirements between interconnecting PCBs, adversely affecting density and number of FRUs within the system;
20. Eliminates the problem of very long PCBs and their signal traces (as in a DPO system); conversely, enables larger rack-based systems in the most important axis of space freedom, the vertical direction. Additionally, mating tolerance issues are avoided with the assembly by forgoing very long interconnecting PCBs required for systems deploying DPO;
21. Eliminates unfavorable temperature rises and serviceability issues. For FRU PCB-PCB backplane interconnected systems, airflow direction is usually top-to-bottom, involving accumulative flow impedance and resulting unfavorable temperature rises. For DPO systems, air flow can be front-to-back to avoid these temperature rises, but cooling fans either trapped by long interconnecting PCBs within the system or are trapped by them. This causes serviceability issues and obscuring of indicator light visibility. All of these issues are eliminated by the physical geometry and placement of the assembly.

22. Lowers cost. Complex switch-to-switch fabric routing resides within the infrastructure of the assembly and not within the PCB assemblies that plug into it, resulting in lower costs of these higher cost system components.

Further features and benefits of embodiments of the disclosed assembly will become apparent from the detailed description below.

BRIEF DESCRIPTION OF THE DRAWINGS

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION

The present invention will now be described more fully hereinafter with reference to the accompanying drawings, in which exemplary embodiments of the invention are shown. In the below, for purposes of explanation and not limitation, specific details are set forth in order to provide a thorough understanding of the present invention. It will be apparent to one skilled in the art that the present invention may be practiced in other embodiments that depart from these specific details.

Disclosed herein is a novel cable backplane assembly that provides very high speed electronic interconnect within next generation telecommunication and data center systems.

Figure 1:
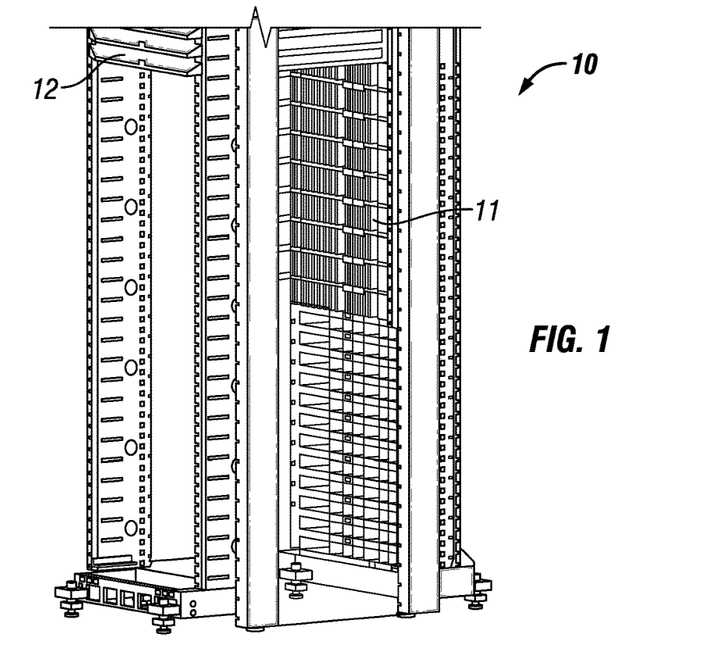
FIG. 1 is a perspective view of an equipment rack in which the disclosed cable backplane assembly has been implemented.

FIG. 1 is a perspective view of a standard 19-inch equipment rack 10 in which the disclosed backplane assembly 11 has been implemented. The rack provides internal system interconnect for the rack-based system's removable components such as Line Card (LC) Field Replaceable Units (FRUs) 12.

Figure 2:
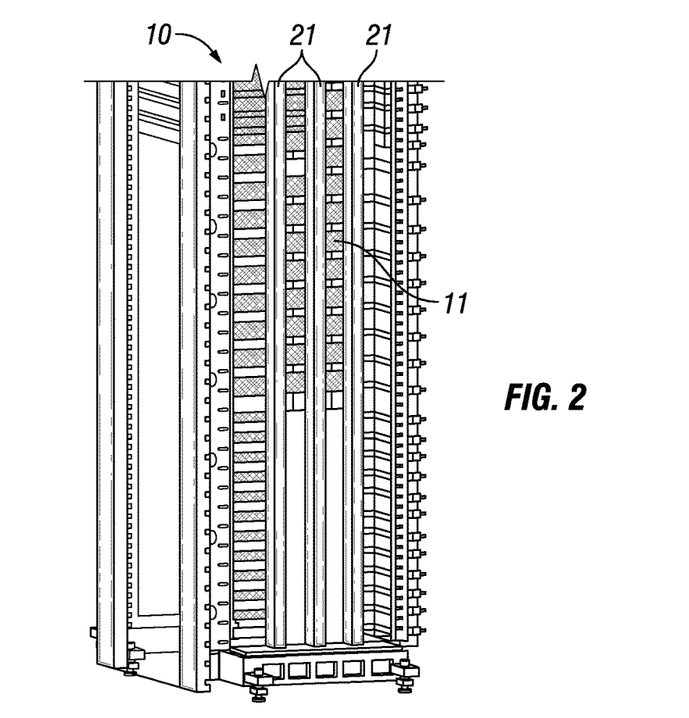
FIG. 2 is a rear view of the rack of FIG. 1 showing the cable backplane assembly.
Figure 5:
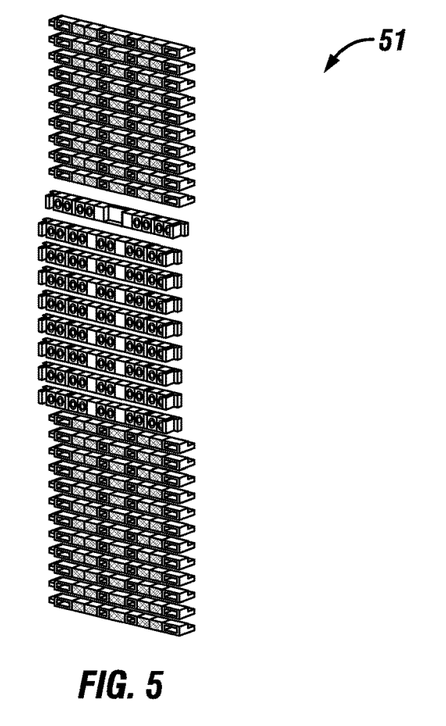
FIG. 5 illustrates an exemplary series of parallel horizontal metallic plates configured as cable connector carrying trays.

FIG. 2 is a rear view of the rack 10 of FIG. 1 showing the cable backplane 11 and three enclosed vertical cable channels (21) for protectively routing cables to a plurality of parallel horizontal plates configured as cable connector carrying trays (see FIG. 5). The assembly employs cable backplane connectors and their wiring harnesses in addition to leading-edge optical connectors and their smaller ribbon cables. These connector and cable sub-assemblies provide the interconnects normally found within a fixed PCB-type backplane, plus attributes and functionality not otherwise possible.

Figure 3:
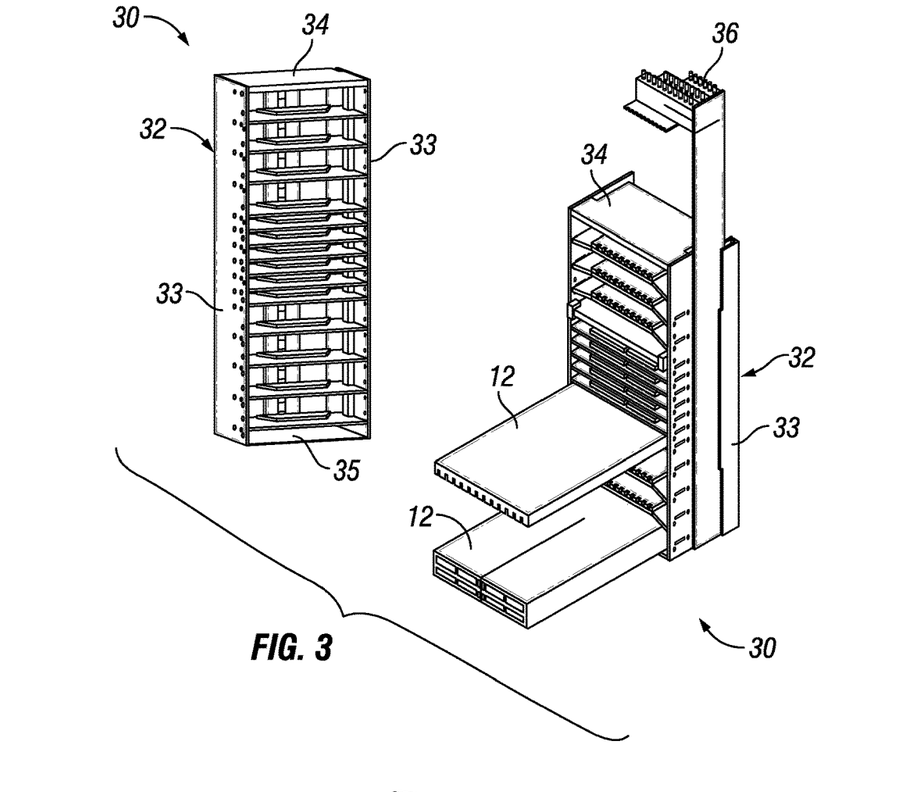
FIG. 3 illustrates an exemplary modular cable backplane assembly of the present disclosure, and a front perspective view of the cable backplane assembly showing how FRUs may be mounted thereon.

FIG. 3 illustrates an exemplary modular cable backplane assembly 30 of the present disclosure, and a front perspective view of the backplane assembly showing how FRUs 12 may be mounted thereon. Cable subassemblies are housed within a rigid chassis 32 (for example a metal structure) that encloses them, providing protection from high speed cooling air flow and EMC. The chassis may include rigid vertical side plates 33, a top plate 34, and a bottom plate 35. Provision is also made for a power input feeds 36 to the FRUs.

Figure 4:
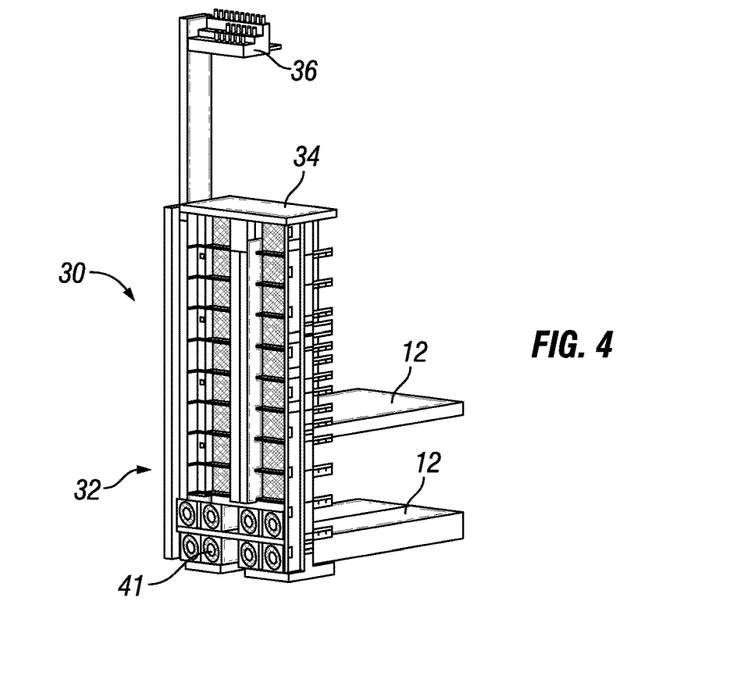
FIG. 4 illustrates a rear perspective view of the exemplary modular cable backplane assembly of FIG. 3 showing the FRUs and cooling fans mounted thereon.

FIG. 4 illustrates a rear perspective view of the exemplary modular backplane assembly 30 of FIG. 3 showing the FRUs 12 and other system components mounted thereon. The rigid chassis also provides an internal mounting structure for other system components such as cooling fans 41. The cooling fans may be mounted on mounting points for horizontal rows of cooling fans aligned with each of a plurality of parallel horizontal plates configured as cable connector carrying trays (see FIG. 5). Mounting of the cooling fans is described in more detail below.

FIG. 5 illustrates an exemplary series of parallel horizontal plates 51 configured as cable connector carrying trays, which capture high-speed data, power and guidance connectors. The parallel horizontal plates may be constructed of a rigid material such as metal, for example. The horizontal cable trays may be attached to the rigid vertical side plates 33 at each side of the assembly, which provide a rigid chassis for the assembly. The trays may be configured to float in three dimensions to allow for tolerance misalignment. The backsides of the data connectors, or headers, are terminated with cables allowing for superior data transmission and SI. Mounting of the trays is shown in more detail in FIGS. 9 and 10.

Figure 6:
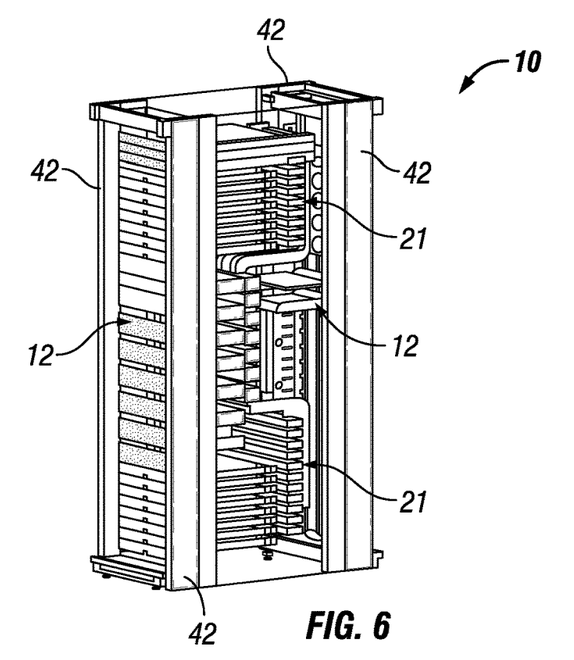
FIG. 6 illustrates a side perspective view of the rack showing FRUs of differing lengths and FRUs mounted back-to-back on the disclosed assembly.

FIG. 6 illustrates a side perspective view of the rack 10 showing FRUs 12 mounted on the disclosed assembly. Cable runs are protectively routed within the vertical cable channels 21 attached to the plates and trays, creating enclosed chambers for the cables. Changing the configuration of the cable channels 21 (see FIG. 7) provides 3-dimensional interconnect planes, allowing different length FRUs and FRUs with multiple interconnect/interface depth. Additionally, FRUs may be loaded on the same horizontal level from both the front and the rear of the rack when the configuration of the cable channels is changed. FIG. 6 shows an example where identical FRUs are loaded from both the front and the rear of the rack 10. Additionally, in this embodiment, four vertical corner rails 42 may attach to the top plate 34 and the bottom plate 35 (not shown) to form the rigid chassis.

Figure 7:
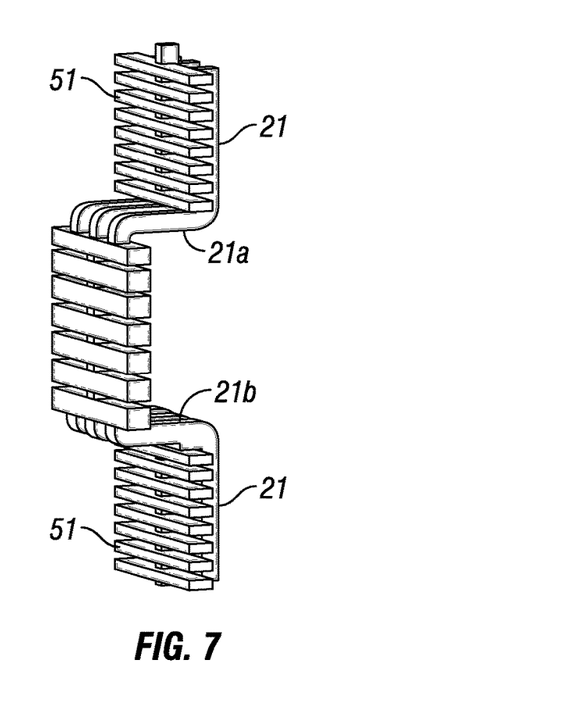
FIG. 7 is a side perspective view of an exemplary configuration of the vertical cable channels and the horizontal cable trays when isolated from the other components of the backplane assembly.

FIG. 7 is a side perspective view of an exemplary configuration of the vertical cable channels 21 and the horizontal cable trays 51 when isolated from the other components of the backplane assembly. Different depth FRUs 12 can be accommodated by changing the configuration of the vertical cable channels by connecting short horizontal sections 21a and 21b to the channels, thereby shifting the channels and the cable trays fore and aft in the rack. FRUs can also be plugged into the assembly from the front and rear of the rack using this approach, as shown in FIG. 6.

The disclosed cable assembly is thus a removable interconnecting infrastructure that is modular and readily reconfigured in the field. The cable trays are designed such that air flow can easily pass over their top plates open channels for flow are provided by the nature of the geometry of the assembly.

Figure 8:
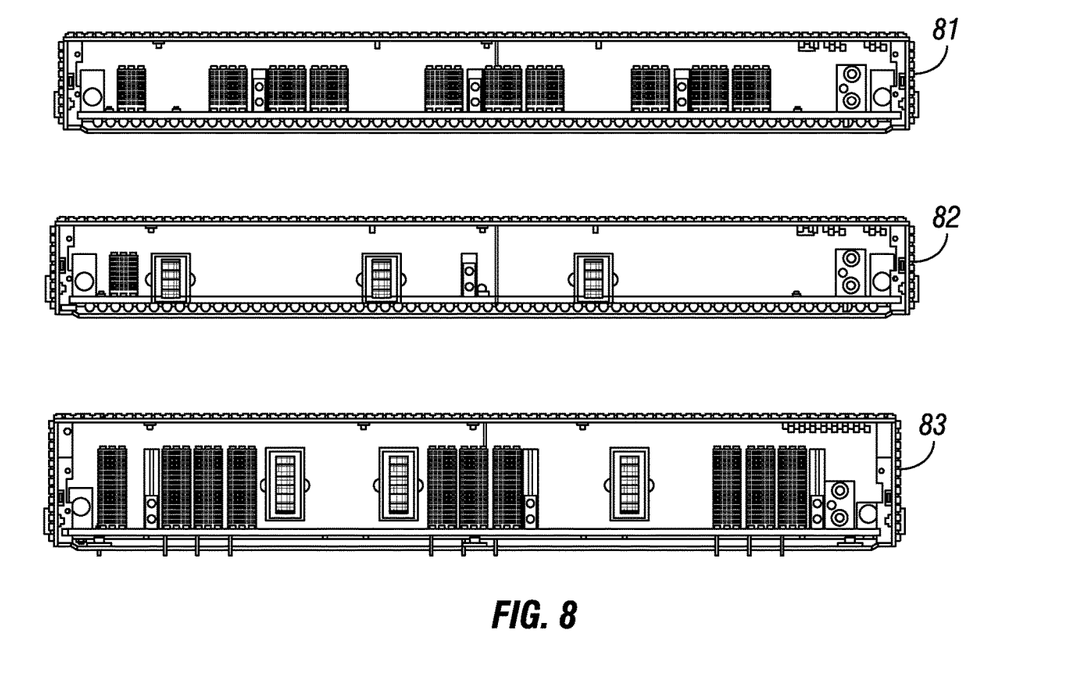
FIG. 8 illustrates three exemplary configurations of the LC/cable backplane interface for all copper, hybrid copper/optical, and all optical embodiments.

FIG. 8 illustrates three exemplary configurations of the LC/cable backplane interface. An all copper interface 81, an all optical interface 82, and a hybrid copper/optical interface 83 are shown.

Figure 9:
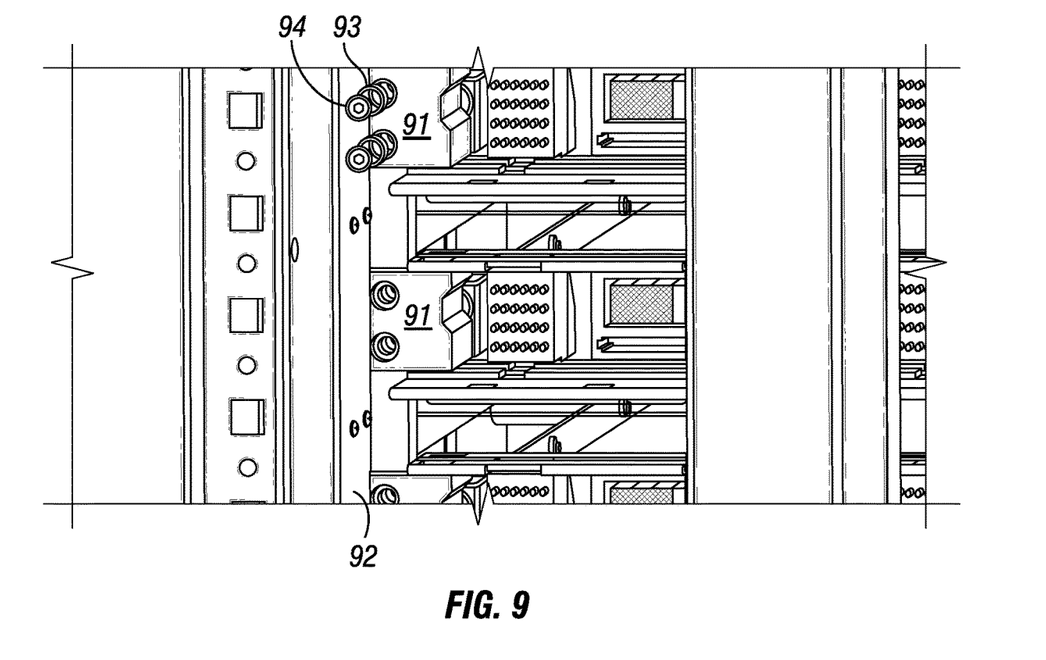
FIG. 9 illustrates an exemplary embodiment of mounting blocks configured to mount the cable trays while allowing the trays to float in three dimensions.

FIG. 9 illustrates an exemplary embodiment of mounting blocks 91 configured to mount the cable trays 51 while allowing the trays to float in three dimensions. The mounting blocks connect firmly to the cable trays, but are movably connected to side rails 92 by compression springs 93 installed around the diameter of shoulder screws 94. The springs allow for Z-axis movement (fore and aft). The mounting blocks have mounting holes for the shoulder screws that are large enough with respect to the shoulder screw diameter to provide radial float in the X-axis (right and left) and the Y-axis (up and down). Movement of the cable trays within a limited range facilitates alignment and connection with cable connectors and FRUs. With this arrangement, a robust ground is required between these non-fixed elements, to preclude getting a digital ground through the shoulder screw threads into the fixed block. In one embodiment, flat springs are mounted in a cantilevered beam fashion between the movable elements to make the electrical contact while allowing three-axis movement of the otherwise connected components.

Figure 10:
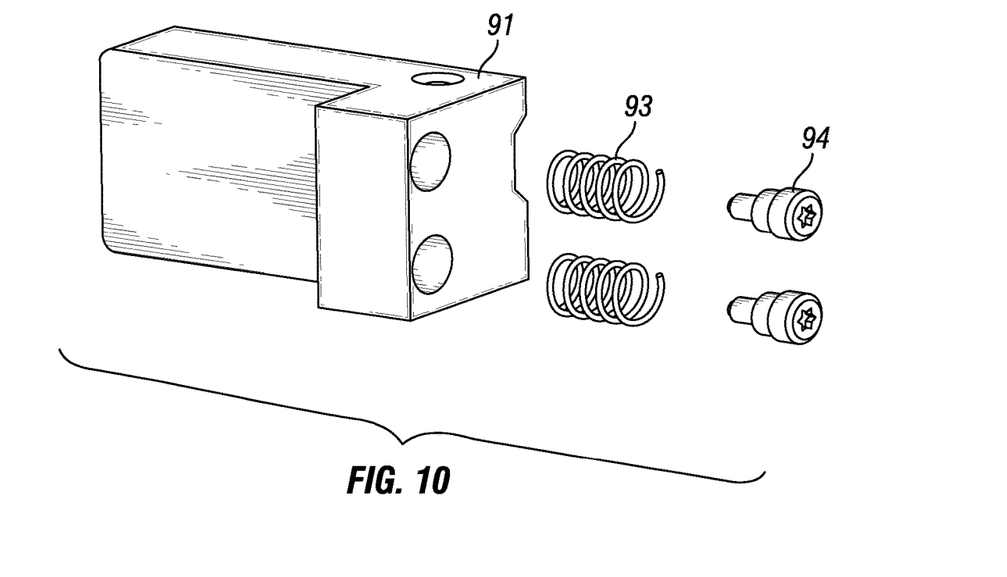
FIG. 10 is a more detailed perspective view of an exemplary individual mounting block of FIG. 9.

FIG. 10 is a more detailed perspective view of an exemplary individual mounting block 91 of FIG. 9 showing exemplary compression springs 93 and shoulder screws 94.

Figure 11:
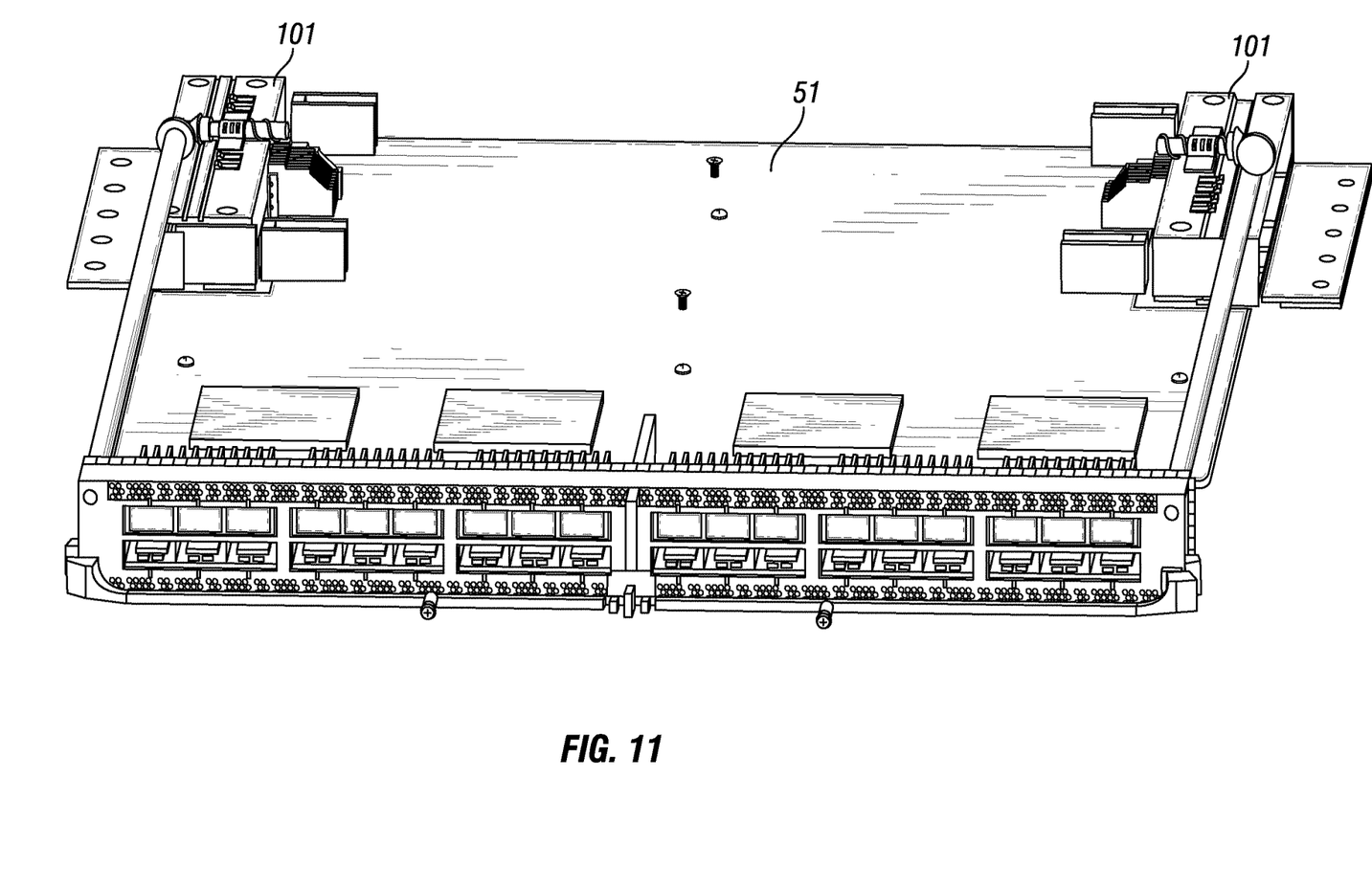
FIG. 11 illustrates an alternative embodiment of a cable connector tray configured for side access and with two position-adjusting mechanisms.

FIG. 11 illustrates an alternative embodiment of a cable connector tray 51 configured for side access and with two exemplary position-adjusting mechanisms 101. The position-adjusting mechanisms allow the position of the tray to be adjusted left and right in the rack 10.

Figure 12:
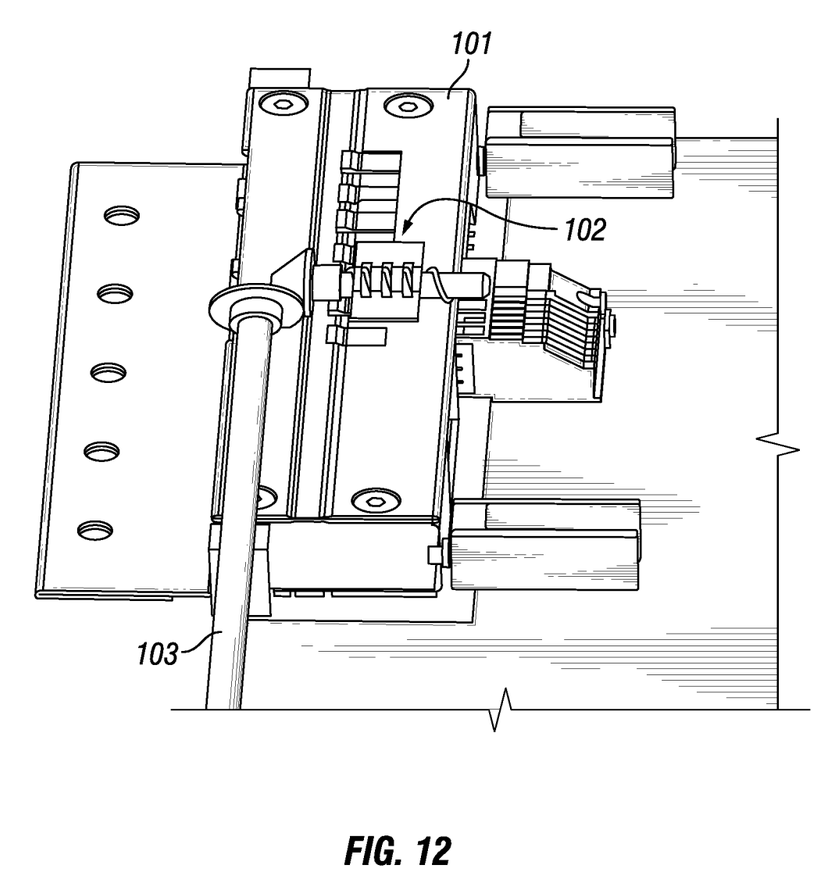
FIG. 12 is a more detailed perspective view of an individual position-adjusting mechanism of FIG. 11.

FIG. 12 is a more detailed perspective view of an individual position-adjusting mechanism 101 of FIG. 11. A rack and pinion mechanism 102 causes the tray to move left or right when a shaft 103 is rotated.

Figure 13:
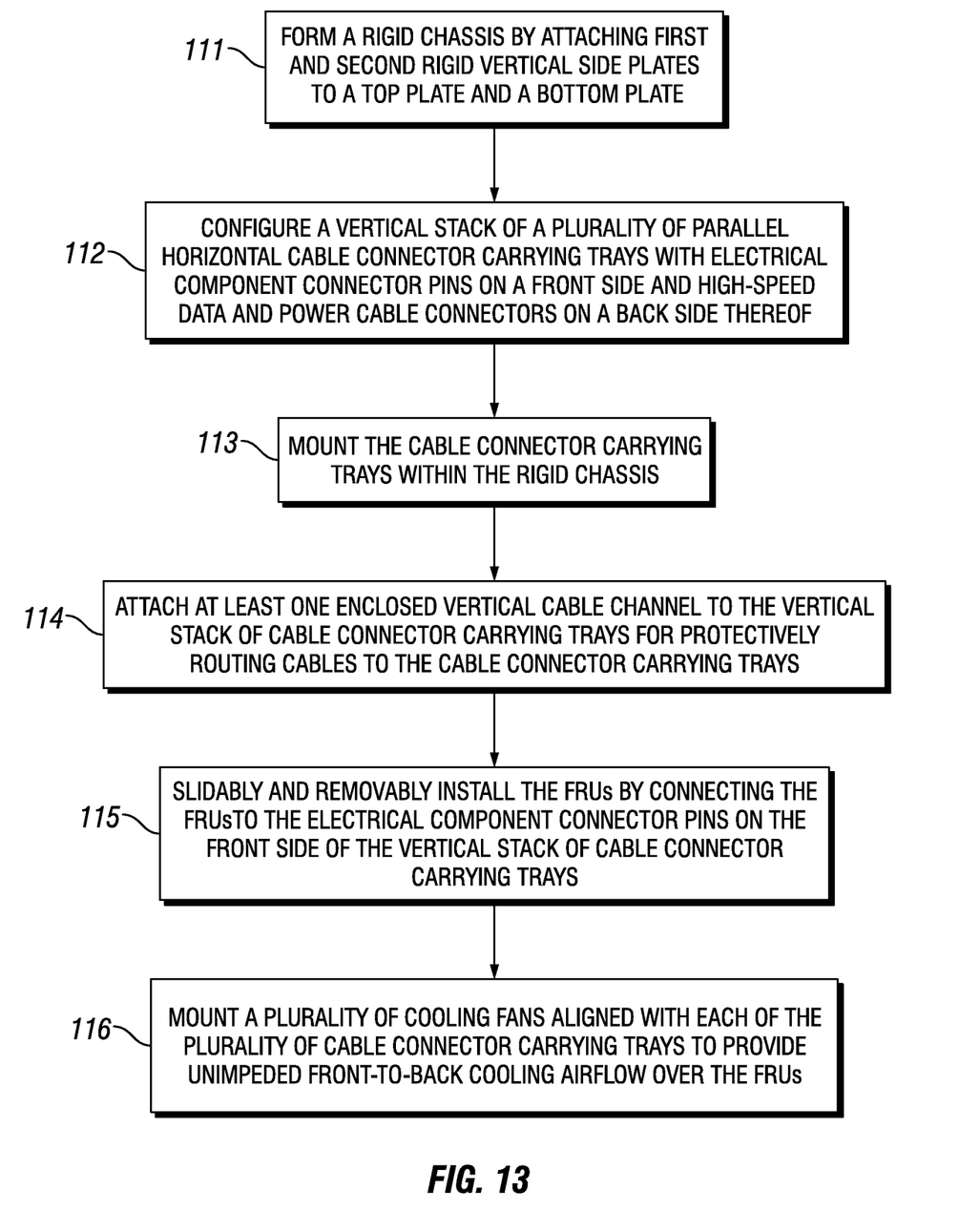
FIG. 13 is a flow chart illustrating an exemplary method of cooling digital electrical components in FRUs mounted in the equipment rack.

FIG. 13 is a flow chart illustrating an exemplary method of cooling digital electrical components in FRUs 12 mounted in an equipment rack 10. At step 111, a rigid chassis is formed by attaching first and second rigid vertical side plates (33) to a top plate 34 and a bottom plate 35. At step 112, a vertical stack of a plurality of parallel horizontal cable connector carrying trays 51 is configured with electrical component connector pins on a front side and high-speed data and power cable connectors on a back side thereof. At step 113, the cable connector carrying trays are mounted within the rigid chassis. At step 114, at least one enclosed vertical cable channel 21 is attached to the vertical stack of cable connector carrying trays 51 for protectively routing cables to the cable connector carrying trays. At step 115, the FRUs are slidably and removably installed by connecting the FRUs to the electrical component connector pins on the front side of the vertical stack of cable connector carrying trays. At step 116, a plurality of cooling fans are mounted aligned with each of the plurality of cable connector carrying trays to provide unimpeded front-to-back cooling airflow over the FRUs.

Figure 14:
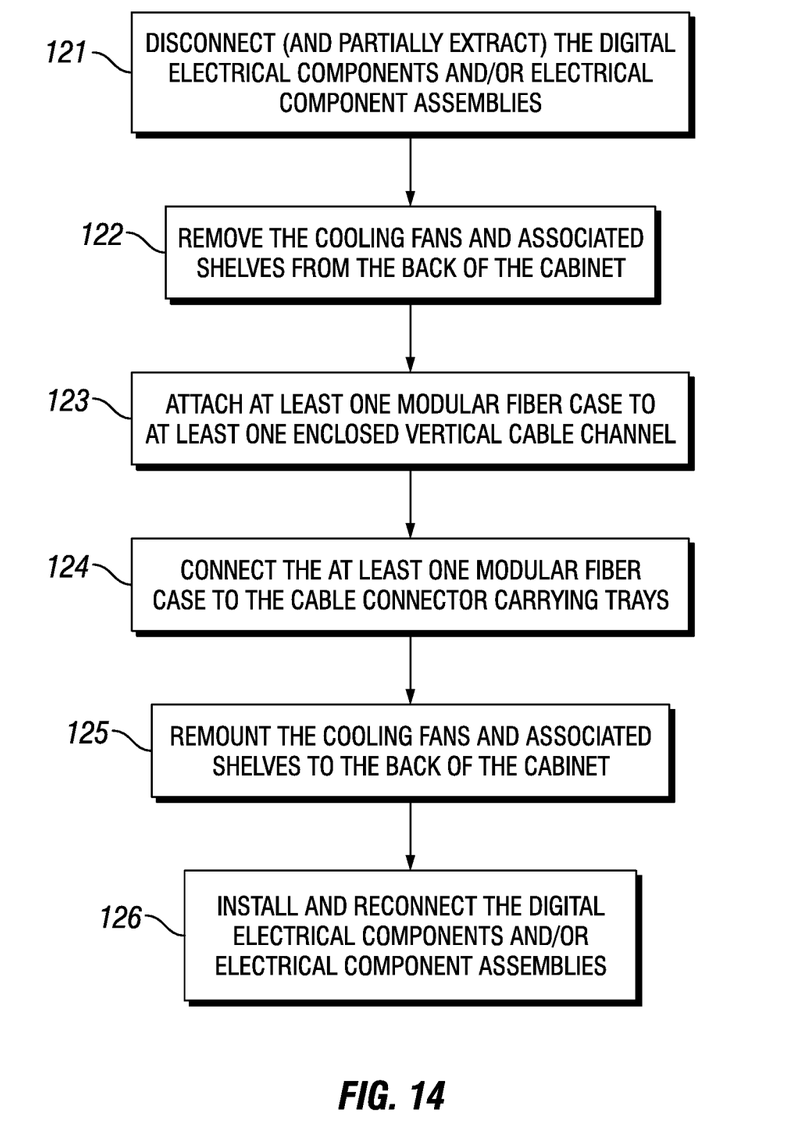
FIG. 14 is a flow chart illustrating an exemplary method of converting, in situ, the cable backplane assembly from copper connections to optical connections.

FIG. 14 is a flow chart illustrating an exemplary method of converting, in situ, the cable backplane assembly from copper connections to optical connections. At step 121, the digital electrical components and/or electrical component assemblies 12 are disconnected from the cable connector carrying trays 51. The assemblies may be partially extracted, but do not have to be fully extracted. At step 122, the cooling fans 41 and associated shelves 131 are removed from the back of the rack. At step 123, at least one modular fiber case 132 is attached to at least one enclosed vertical cable channel 21. At step 124, the modular fiber case is connected to the cable connector carrying trays. At step 125, the cooling fans and associated shelves are remounted to the back of the rack. At step 126, the digital electrical components and/or electrical component assemblies are reconnected to the cable connector carrying trays.

Figure 15:
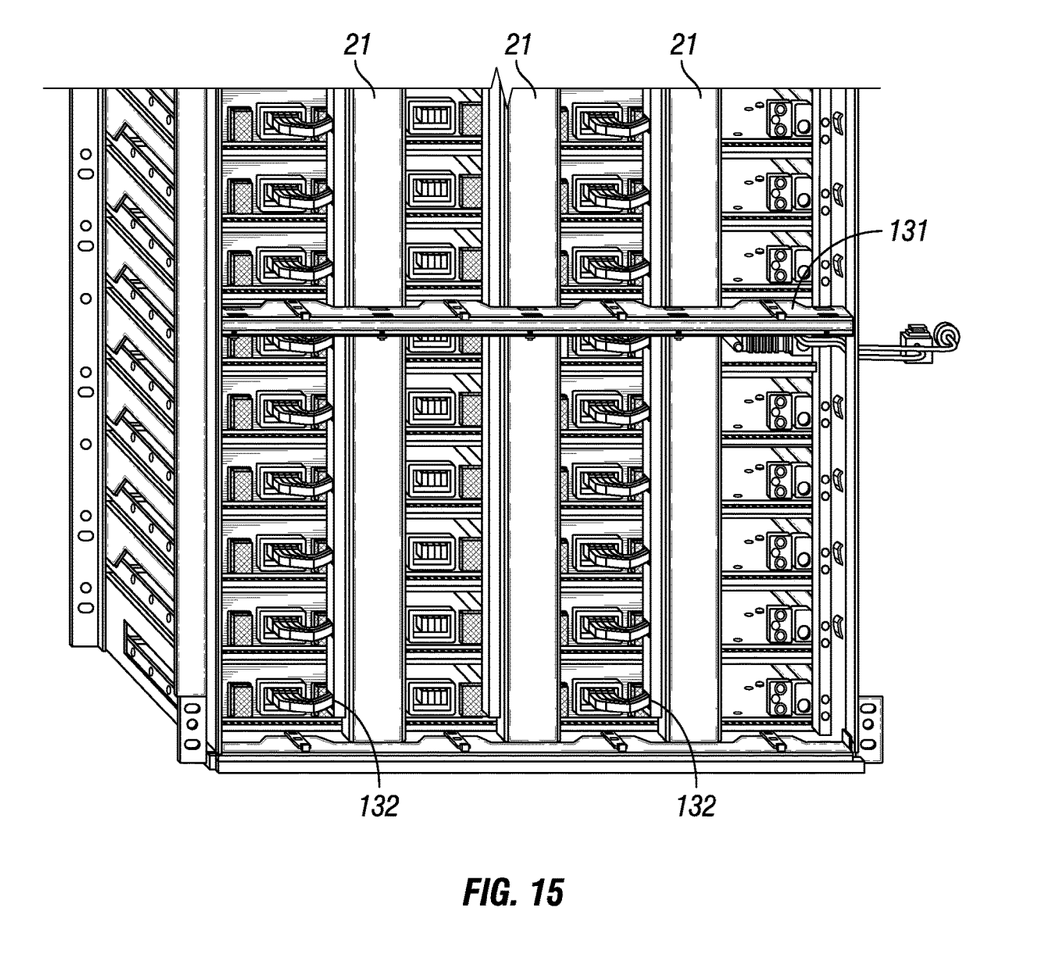
FIG. 15 is a rear view of a cable backplane assembly while being upgraded, in situ, from copper connections to optical connections as described in FIG. 14.

FIG. 15 is a rear view of a cable backplane assembly while being upgraded, in situ, from copper connections to optical connections as described in FIG. 14. As illustrated in FIG. 15, steps 121-124 have been performed, and the assembly now includes two modular fiber cases 132 attached to two of the enclosed vertical cable channels 21. The modular fiber cases have been connected to the cable connector carrying trays. In addition, one fan/FRU interconnect shelf 131 has been remounted to the back of the rack. With additional shelves and the associated fans, the upgrade is complete, and the FRUs can be reconnected.

The disclosed assembly enables high performance switch fabric connections and an open airflow path to cool, for example, 80 kWatts per rack. The switch fabric may support up to 72 lanes of copper wire or fiber optic links. To help transition between copper and fiber optics, both technologies may be housed in a hybrid version of the cable backplane. The three versions of the cable backplane are field upgradable, protecting customer investment and avoiding chassis forklift upgrades.

It should be noted that the above-mentioned embodiments illustrate rather than limit the invention, and that those skilled in the art will be able to design many alternative embodiments without departing from the scope of the appended claims. Any reference signs in the claims shall not be construed so as to limit their scope.

The invention claimed is:

1. A cable backplane assembly for high-speed interconnection of digital electrical components and/or electrical component assemblies mounted in an equipment rack, said assembly comprising:
   first and second rigid vertical side plates attached to a top plate and a bottom plate to form a rigid chassis;
   a vertical stack of a plurality of parallel horizontal cable connector carrying trays received within the rigid chassis, wherein the cable connector carrying trays are configured with electrical component connector pins on a front side and high-speed data and power cable connectors on a back side thereof;

at least one enclosed vertical cable channel attached to the vertical stack of cable connector carrying trays for protectively routing cables to the cable connector carrying trays, wherein the at least one enclosed vertical cable channel includes multiple sections, each section configured at a different distance from a front side of the rack to allow connection to digital electrical components and/or electrical component assemblies of differing lengths; and mounting points for a plurality of cooling fans aligned with each of the plurality of cable connector carrying trays to provide front-to-back cooling airflow.

2. The assembly according to claim 1, wherein the cable connector carrying trays are movably mounted to allow the trays to shift position in three dimensions for tolerance misalignment when connecting electrical components or cables.

3. The assembly according to claim 1, wherein vertical spacing of the plurality of parallel horizontal cable connector carrying trays enables the cooling fans to provide unimpeded front-to-back airflow over the digital electrical components and/or electrical component assemblies.

4. The assembly according to claim 3, wherein the vertical spacing of the plurality of parallel horizontal cable connector carrying trays is variable.

5. The assembly according to claim 3, wherein the unimpeded front-to-back cooling airflow enables higher-power inputs to Field Replaceable Units (FRUs) without connector capacity limitations.

6. The assembly according to claim 1, wherein one or more sections of the at least one enclosed vertical cable channel that are configured at a sufficient distance from a back side of the rack are configured with cable connector carrying trays on a back side of the at least one vertical cable channel to allow connection to digital electrical components and/or electrical component assemblies loaded from the back side of the rack.

7. The assembly according to claim 1, wherein the cable connector carrying trays spread connector pins across the entire width of the circuit board, thereby reducing the distance between connectors and switch fabric components.

8. The assembly according to claim 1, wherein the first and second rigid vertical side plates, the top plate, the bottom plate, and the cable connector carrying trays are metallic and provide increased electromagnetic compatibility (EMC) and reduced electromagnetic interference (EMI) between the electrical components in the rack.

9. A removable cable backplane assembly providing high-speed interconnection of digital electrical components in Field Replaceable Units (FRUs) mounted in an equipment rack, said assembly comprising:

four vertical corner rails attached to a top plate and a bottom plate to form a rigid chassis;

a vertical stack of a plurality of parallel horizontal cable connector carrying trays received within the rigid chassis, wherein the cable connector carrying trays are configured with electrical component connector pins on a front side and cable connectors on a back side thereof; and at least one enclosed vertical cable channel received within the chassis for protectively routing cables to the vertical stack of parallel horizontal cable connector carrying trays wherein the cable backplane assembly is replaceably received in the rack to enable the cable backplane assembly to be removed and replaced as a unit, wherein the at least one enclosed vertical cable channel includes multiple sections, each section configured at a different distance from a front side of the rack to allow connection to FRUs of differing lengths.

10. The assembly according to claim 9, wherein the cable connector carrying trays are movably mounted to allow the trays to shift position in three dimensions for tolerance misalignment when connecting the cables to the FRUs.

11. The assembly according to claim 9, wherein one or more sections of the at least one enclosed vertical cable channel that are configured at a sufficient distance from a back side of the rack are configured with cable connector carrying trays on a back side of the at least one vertical cable channel to allow connection to FRUs loaded from the back side of the rack.

12. The assembly according to claim 9, wherein one or more sections of the at least one enclosed vertical cable channel that are configured at a sufficient distance from a back side of the rack are configured with cable connector carrying trays on both a front side and a back side of the at least one vertical cable channel to allow connection to FRUs loaded from the front side and the back side of the rack.

13. The assembly according to claim 9, further comprising means for side-connecting at least one FRU side-fed from a right side or left side of the rack to at least one cable connector carrying tray wherein the at least one cable connector carrying tray is movably mounted so that the position of the at least one cable connector carrying tray is adjustable to the right or to the left to accommodate side-fed FRUs of different lengths.

14. The assembly according to claim 9, further comprising mounting points for a plurality of cooling fans aligned with each of the plurality of cable connector carrying trays to provide front-to-back cooling airflow.

15. The assembly according to claim 14, wherein vertical spacing of the plurality of parallel horizontal cable connector carrying trays enables the cooling fans to provide unimpeded front-to-back airflow over the FRUs.

16. The assembly according to claim 7, wherein the at least one enclosed vertical channel includes multiple sections, wherein each section is configured at a different distance from a front side of the rack to allow connection to FRUs of differing lengths.

17. The assembly according to claim 16, wherein one or more sections of the at least one enclosed vertical cable channel that are configured at a sufficient distance from a back side of the rack are configured with cable connector carrying trays on a back side of the at least one vertical cable channel to allow connection to FRUs loaded from the back side of the rack.

18. The assembly according to claim 16, wherein one or more sections of the at least one enclosed vertical cable channel that are configured at a sufficient distance from a back side of the rack are configured with cable connector carrying trays on both a front side and a back side of the at least one vertical cable channel to allow connection to FRUs loaded from the front side and the back side of the rack.

19. A method of cooling digital electrical components in Field Replaceable Units (FRUs) mounted in an equipment rack, the method comprising:

forming a rigid chassis by attaching first and second rigid vertical side plates to a top plate and a bottom plate;

mounting within the rigid chassis, a vertical stack of a plurality of parallel horizontal cable connector carrying trays wherein the cable connector carrying trays are configured with electrical component connector pins on a front side and high-speed data and power cable connectors on a back side thereof;

attaching at least one enclosed vertical channel to the vertical stack of cable connector carrying trays for protectively routing cables to the cable connector carrying trays, wherein the at least one enclosed vertical cable channel includes multiple sections, each section configured at a different distance from a front side of the rack to allow connection to FRUs of differing lengths;

slidably and removably installing the FRUs by connecting the FRUs to the electrical component connector pins on the front side of the vertical stack of cable connector carrying trays; and mounting a plurality of cooling fans aligned with each of the plurality of cable connector carrying trays to provide front-to-back cooling airflow over the FRUs;

wherein vertical spacing of the plurality of parallel horizontal cable connector carrying trays enables the cooling fans to provide unimpeded front-to-back airflow over the FRUs.

20. The method according to claim 19, wherein the vertical spacing of the plurality of parallel horizontal cable connector carrying trays is variable.

21. A method of converting, in situ, the cable backplane assembly of claim 1 from copper connections to optical connections, the method comprising:

disconnecting the digital electrical components and/or electrical component assemblies from the cable connector carrying trays;

removing the cooling fans and associated shelves from the back of the rack;

attaching at least one modular fiber case to at least one enclosed vertical cable channel, wherein the at least one enclosed vertical cable channel includes multiple sections, each section configured at a different distance from a front side of the rack to allow connection to digital electrical components and/or electrical component assemblies of differing lengths;

connecting the at least one modular fiber case to the cable connector carrying trays;

remounting the cooling fans and associated shelves to the back of the rack; and reconnecting the digital electrical components and/or electrical component assemblies to the cable connector carrying trays.

* * * * *